(12) United States Patent
Whalen

(10) Patent No.: US 6,773,220 B1
(45) Date of Patent: Aug. 10, 2004

(54) SEMI-CONDUCTOR WAFER CASSETTES MODULAR STOCKER

(75) Inventor: Paul S. Whalen, Monterey, CA (US)

(73) Assignee: Intrabay Automation, Inc., Monterey, CA (US)

( * ) Notice: Subject to any disclaimer, the term of this patent is extended or adjusted under 35 U.S.C. 154(b) by 629 days.

(21) Appl. No.: 09/845,538

(22) Filed: Apr. 30, 2001

(51) Int. Cl.$^7$ .............................................. B65G 1/00
(52) U.S. Cl. ..................................... 414/267; 414/940
(58) Field of Search ............................... 414/266, 267, 414/280, 281, 940, 268

(56) References Cited

U.S. PATENT DOCUMENTS

| | | | | |
|---|---|---|---|---|
| 5,466,109 A | * | 11/1995 | Iizuka | 414/283 |
| 6,036,812 A | * | 3/2000 | Williams et al. | 156/277 |
| 6,079,927 A | * | 6/2000 | Muka | 414/217 |
| 6,082,844 A | * | 7/2000 | Hausler et al. | 312/283 |
| 6,160,786 A | * | 12/2000 | Coffin et al. | 369/30.43 |
| 6,229,667 B1 | * | 5/2001 | Ostwald | 360/92 |
| 6,379,096 B1 | * | 4/2002 | Beutler et al. | 414/281 |
| 6,506,009 B1 | * | 1/2003 | Nulman et al. | 414/217.1 |
| 6,655,532 B1 | * | 12/2003 | Kitanaka et al. | 211/26 |

* cited by examiner

Primary Examiner—Thomas J. Brahan
(74) Attorney, Agent, or Firm—David O'Reilly

(57) ABSTRACT

A modular stocker for storage and retrieval of semi-conductor wafer cassettes that minimizes system down time for repair of replacement of components. The modular stocker is comprised of a rectangular or half cylindrical enclosure formed by vertical beams secured by a plurality of horizontal joists. A pick up and transfer device for storing and retrieving semi-conductor wafer cassettes in the stocker has a linear arm and a paddle or gripper for picking up the cassettes. The linear arm and paddle or gripper are driven vertically, horizontally, and rotationally by a plurality of servo motors which are mounted on a detachable chassis that forms one side of the stocker. Quick disconnect fasteners at the corners of the chassis and bottom mounted casters allow the entire chassis with the pick up and transfer device to be disconnected and rolled out of the stocker for repair or replacement. The stocker electronics are mounted on removable panels that slide in or out of the stocker on rails. The modular construction of the stocker allows quick and efficient repair or replacement of the pick up and transfer device or system electronics to restore a stocker to service with minimum down time.

8 Claims, 2 Drawing Sheets

SEMI-CONDUCTOR WAFER CASSETTES MODULAR STOCKER

BACKGROUND OF THE INVENTION

1. Field of the Invention

This invention relates to storage devices for storing semi-conductor wafer cassettes known as stockers and more particularly relates to a modular stocker that simplifies repair and maintenance by removal and replacement of system modules.

2. Background Information

Semi-conductor wafer fabrication involves hundreds of processes for producing electronic chips or integrated circuits such as microprocessors, computer memory and other microcircuits. Throughout the fabrication process, the semi-conductor wafers are transported from one processing station or area in sealed cassettes. The cassettes separate the wafers and prevent wafer-to-wafer contact. The cassettes are transported in sealed containers or in plastic boxes or may be open without container. The semi-conductor wafers must be kept in a class 1 substantially contaminant-free environment throughout the fabrication processing.

In between processing steps the cassettes for the semi-conductor wafers are stored in enclosures known as stockers. Each cassette may have up to twenty-five 200 mm (8 inch) semi-conductor wafers. The cassettes are manually or by an automatic transport system moved out of the stockers through a port or window to a processing station. After each process is complete, the semi-conductor wafers are returned to the cassette and then usually delivered back to the stocker to await further processing or to another stocker at the next processing step. There may be very many stockers strategically placed at intervals along the production line for easy access by personnel performing the processing.

The stockers have a plurality of open frame slots or shelves inside a substantially rectangular or half cylindrical enclosure. Semi-conductor wafer cassettes are returned or retrieved through a port or window in the stocker. After a particular process is complete, the semi-conductor wafer cassette is either manually or by an automatic transport system returned to a shelf at the in/out window or port. An automatic pick up and transfer device picks up the semi-conductor wafer cassette and places it in an empty slot or shelf in the stocker to await the next processing step.

The pick up and transfer device is comprised of a horizontal linear-arm that is moved up and down inside the stocker, has a paddle or gripper for picking up the cassette or cassette container and is driven by several programmed servo motors. Vertical and rotational movement of the linear arm is performed by the programmed servo motors. Another servo motor moves the paddle or gripper horizontally in and out into position beneath a cassette. The system always knows where there is an empty slot or shelf in the stocker. Once a semi-conductor wafer cassette is placed in the input port, the pick up and transfer device is triggered to move into position vertically and rotationally at the input port, moves the paddle forward to pick up the cassette. The paddle with the cassette is then retracted and the pick up and transfer device quickly moves inside the stocker to a position adjacent an empty slot or shelf. The paddle then deposits the cassette on the shelf and is retracted and the linear arm returned to a standby position to await the next semi-conductor wafer cassette being retrieved or stored. The retrieval of a semi-conductor wafer cassette from the stocker is just a reversal of the process of storing a cassette described above.

Since there are very many of these stockers throughout the processing plant, it is essential that they be kept operational as much as possible. Breakdowns in the stocker electronic circuits or pick up and transfer device can disrupt the entire production line causing costly delays. Stockers currently available have to be dismantled to get at electronic circuits and pick up and transfer devices when there is a breakdown. The breakdowns cause downtimes of at least many hours, or days and can be even longer.

It is therefore one object of the present invention to restore a semi-conductor wafer cassette stocker to service in the shortest possible time.

Another object of the present invention is to provide a semi-conductor wafer cassette stocker that can be returned to service in minutes rather than hours or more.

Still another object of the present invention is to construct a stocker with modular assemblies that can be easily and quickly replaced.

Yet another object of the present invention is to provide a semi-conductor wafer stocker with modular electronic circuits mounted on roll-in roll-out panels that can be easily and quickly removed and replaced.

Still another object of the present invention is to provide a pick up and transfer device on a removable chassis that can be quickly and easily detached from the stocker and replaced. Yet another object of the present invention is to mount the pick up and transfer device chassis on casters to allow it to be detached quickly and removed from the stocker frame.

BRIEF DESCRIPTION OF THE INVENTION

The purpose of the present invention is to provide an improved semi-conductor wafer cassette stocker that simplifies maintenance to minimize down time when repairs or replacements are required.

The stocker of the present invention is comprised of a rectangular or square frame formed of a plurality of vertical beams joined by horizontal extending joists. The outer surface of the stocker frame is covered with a skin of sheet metal or plastic bolted or otherwise secured to the stocker frame to form an enclosure. One, two or three sides are provided with port(s) or window(s) with a shelf at a comfortable height to place semi-conductor wafer cassettes on the return or retrieval from the stocker. A plurality of wire shelves are positioned and attached in rows and columns inside the stocker frame. The stockers may vary in overall size-which depends upon the space available in the production plant. They can be sufficient length, width, and height to store twenty or more semi-conductor wafer cassettes or cassette containers.

Access to and retrieval of the semi-conductor wafer cassettes is by a pick up and transfer system comprised of a rotatable linear arm mounted on a rotary pedestal or platform that is attached to a belt driven linear actuator by a servo motor for precise vertical positioning. A second servo motor rotates the linear arm through an approximately 180 degree range to provide access to semi-conductor wafer cassettes stored on three to six vertical columns within the stocker. A third servo motor moves a pick-up paddle forward and backward to advance, lift, and retract a semi-conductor wafer cassette or cassette container.

The entire pick up and transfer mechanism is mounted on a chassis forming a unitary removable drive assembly. This drive assembly forms one side of the stocker enclosure. The lower end of the assembly has a base or pedestal supporting the linear arm, paddle, and all servo motors. A central vertical beam houses a belt driven vertical linear actuator and is attached to and extends vertically the full height of the stocker.

The drive assembly is uniquely constructed to be removable as a unit from the stocker for repair or replacement. The chassis of the drive assembly has cross braces with quick disconnect fasteners. The cross braces extend horizontally across one side at the top and bottom of rectangular frame of the stocker. Each end of the cross braces fit onto a bolt that is grasped by a quick connect fastener. Rotation of the quick connect fastener in one direction disconnects each end of the upper and lower cross braces allowing complete removal of the drive assembly.

Casters or rollers at the bottom on each corner of the chassis allow the entire assembly to be simply rolled out of the stocker once quick disconnect fastener has been released. This allows removal and replacement of the entire drive assembly in minutes substantially reducing present down times of many hours or days needed to disassemble parts of the stocker to make repairs or replacements.

An additional unique feature is the mounting of all system electronics on removable boards or panels. The electronics are preferably mounted in the stocker on boards or panels that have channels along opposite sides that engage rails on the interior sides of the stocker. Two removable electric panels mounted at the lower end on either side of the drive assembly are preferred. The electronic circuits are connected to the drive system by standard plugs that engage a battery of sockets mounted on the drive assembly chassis or on the electronics panels themselves.

The electronic circuit panel assemblies are removable from the drive assembly side or the opposite side of the stocker frame. They are removed by disconnecting the plugs, and then rolling the entire panel off the rails.

This construction allows all electronic circuits and the drive assembly to be removed and replaced in minutes substantially reducing down time and interruption of the production line. The pick up and transfer drive assembly can be disconnected electronically and mechanically and simply rolled out of the stocker. A replacement drive assembly can be rolled in the plugs reconnected and the quick disconnected fasteners engaged restoring service in minutes. Likewise, the circuit panels can be rolled off the rails and replaced quickly.

The above and other objects, advantages, and novel features of the invention will be more fully understood from the following detailed description and the accompanying drawings, in which:

DETAILED DESCRIPTION OF THE INVENTION

Figure 1:
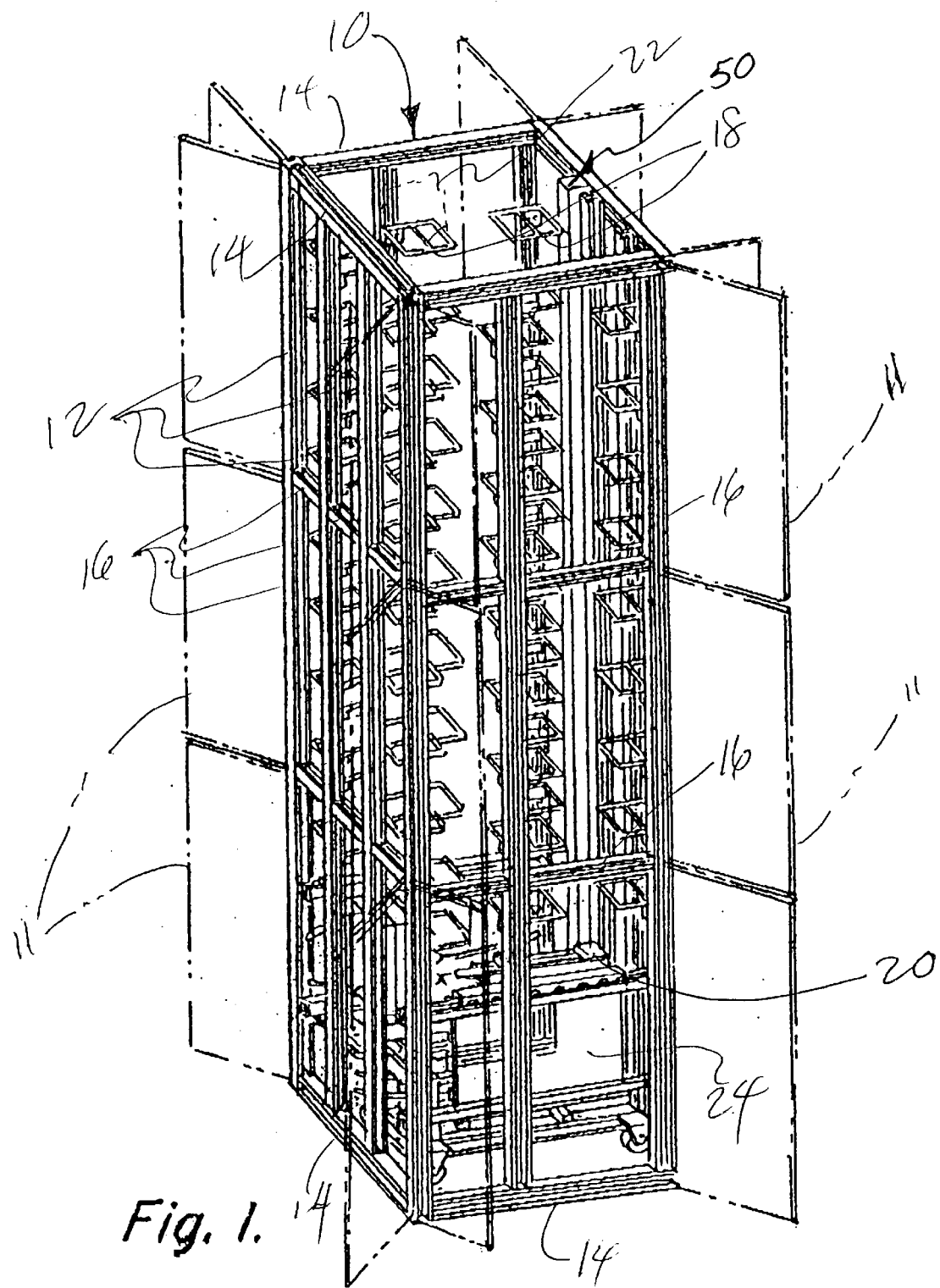
FIG. 1 is an elevational view of a semi-conductor wafer cassettes stocker with an outer covering or panels removed to show the frame construction.

An elevational view of a modular stocker for storing semi-conductor wafer cassettes or containers is illustrated in FIG. 1 with panels 11 in phantom for clarity. Panels 11 forming the outer covering of stocker 10 can be hinged to allow easy access to the interior of the stocker. Stocker 10 is comprised of a rectangular or square frame comprised of a plurality of upright beams 12 joined by cross beams 14 at the top and bottom and intermediate joists 16 between the top and bottom cross-beams 14. Upright beams 12, cross-beams 14 and intermediate joists 16 are preferably of extruded aluminum but could be of other metals or alloys of metals.

Open wire shelves 18 are attached to the beams 12 and 16 on the interior of stocker 10 along three sides opposite and adjacent to pick up and transfer device 20. Shelves 18 are of open wire frame construction to allow free flow of air through the interior of stocker 10. The spacing and number of shelves 18 in the interior of stocker depends upon the size of semi-conductor cassettes 22 (illustrated in phantom) that are being stored in stocker 10. For 200 mm (8 inch) wafers the shelves will be spaced apart horizontally and vertically slightly less than a foot. For 150 mm (6 inch) wafers the spacing is approximately 30% less than that needed for the larger 200 mm wafer cassettes. In some cases stocker 10 will be configured to store reticles for producing integrated circuits from the semi-conductor wafers. Since reticle boxes are much smaller than the larger wafer cassettes the number and spacing of shelves will permit storage of nearly six times as many boxes in stocker 10.

Figure 2:
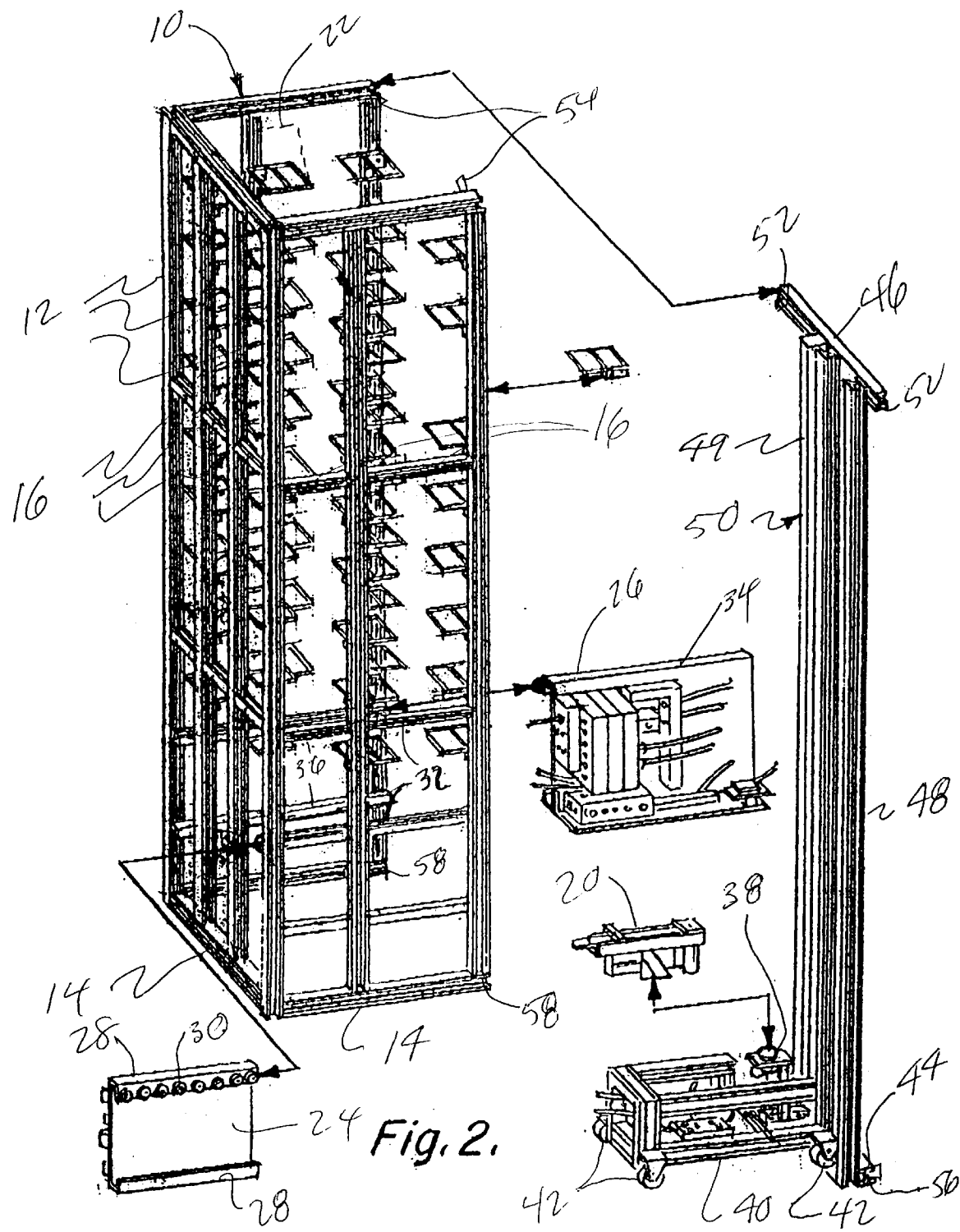
FIG. 2 is an exploded view illustrating the modular construction allowing quick removal of electronic circuit panels and the drive assembly for driving the pick up and transfer system.

A unique feature of stocker 10 is the construction in modular form that allows all mechanical parts and electronic components to be quickly removed for repair or replacement as illustrated in the exploded view of FIG. 2. Electronic components are all mounted on panels 24, 26 that can be easily disconnected and removed from either side of stocker 10. Electronic component panel 24 which may contain the stocker power supply and other electronic circuits is provided with channels 28 and idler rollers 30 that allow the panel to slide onto rails mounted along the inside of stocker 10. Electronic component board or panel 26 will have similar channels 34 and idler rollers 30 for sliding unit stocker 10 on rails 36. Component board 26 may, for example, contain control circuits for the stocker.

Each electronic component board 26 and 28 may be removed from either side of stocker 10. Hinged bolted-on sheet metal panels 11 (shown in phantom) provide an outer covering and are latched so they can be opened to provide access to the interior of stocker 10. To remove either electronic component panel the outer enclosure panel adjacent the electronics panel is unlatched and swung open or removed, the electronics component panels 26 or 28 on rails 32 or 36 can then be removed by rolling each panel out of stocker cabinet for repair or replacement.

Pick up and transfer device 20 is also supported on a modular assembly for easy detachment for repair or replacement. Pick up and transfer device is mounted on servo motor rotary pedestal 38. Servo motor rotary pedestal 38 is mounted on a drive belt in a channel inside a vertical beam 49 forming a vertical belt drive linear actuator 50 for vertical movement of rotary pedestal 38 with pick up and transfer device 20. Vertical belt drive linear actuator 50 is mounted on chassis 40 supported on casters 42. Cross bars 44 and 46 are attached to chassis 40 at the bottom and vertical beam extrusions 48 and 50 respectively at the top.

Quick release connectors 52 on either side of cross bar 46 engage corners 54 of the frame of stocker 10 at the top. Likewise quick release connectors 56 on either end of the bottom cross bar 44 engage corners 58 at the bottom of the frame of stocker 10.

The module system disclosed minimizes down time of a stocker 10 by allowing all electronic components to be quickly removed for repair or replacement. The electronic component panels are quickly and easily removed by unlatching and opening an adjacent panel 11, disconnecting (i.e., unplugging) electrical connectors and rolling respective panel 26 or 28 off respective rails 32 or 36.

All moving parts including the pick up and transfer device 20 is likewise easily detached for repair or replacement. Electrical connectors are unplugged and then quick release connectors released and the entire module assembly of chassis 40, beams 48 and vertical actuator 50, and cross bars 44 and 46 rolled out of the stocker frame. A new pick up and transfer device module containing the three axis 20, 38 and 50 can then be rolled into the frame of stocker, connected electrically with a few plugs and reattached by closing quick release connectors 52, 56 at the top and bottom. The stocker is back in service in minutes rather hours or days with present semi-conductor wafer cassette storage stockers.

This invention is not to be limited by the embodiment shown in the drawings and described in the description which is given by way of example and not of limitation, but only in accordance with the scope of the appended claims.

What is claimed is:

1. A semi-conductor wafer cassette storage apparatus comprising;
   a rectangular frame comprised of a plurality of vertical beams secured by a plurality of horizontally extending joists to form an enclosure;
   a plurality of storage shelves in an array attached to three interior sides of said rectangular frame;
   a pick up and transfer device for storing or retrieving semi-conductor wafer cassettes or cassette containers to or from said shelves;
   electronic circuits mounted on said frame for controlling the operation of said pick up and transfer device;
   one side of said rectangular frame having a chassis for mounting said pick up and transfer device;
   said one side of said rectangular frame being detachable with said chassis and said pick up and transfer device;
   whereby said pick up and transfer device can be quickly removed as a modular unit for repair or replacement.

2. The apparatus accord to claim 1 including upper and lower cross braces on said one side of said rectangular frame forming said chassis; and quick release connectors in each end of said upper and lower cross braces for quickly attaching or detaching said one side with said chassis with pick up and transfer device from said rectangular frame for repair or replacement.

3. The apparatus accord to claim 2 in which said chassis for mounting said pick up and transfer device includes casters whereby said chassis with said pick up and transfer device may be rolled away from said rectangular frame after release of said quick release connectors detaching said upper and lower cross braces from said opposite sides of said rectangular frame.

4. The apparatus accord to claim 3 in which said electronic circuits are mounted for removal as a modular unit.

5. The apparatus accord to claim 4 in which said electronic circuits are mounted on panels forming a detachable circuit panel assembly mounted on a side of said rectangular frame.

6. The apparatus accord to claim 5 including rails along at least one side of said rectangular frame adjacent to said pick up and transfer device; said detachable circuit panel assembly being slidably supported on said rails.

7. The apparatus accord to claim 6 in which said circuit board assembly is supported by a flange forming a channel along at least one edge; a plurality of idler rollers attached to said flange forming said channel; said idler rollers constructed and attached to engage said rail; whereby said at least one circuit board assembly may be quickly removed from said rectangular frame by sliding said circuit board assembly on said rollers.

8. The apparatus accord to claim 7 in which there are two of said electronic circuit panel assemblies mounted on rails on opposite sides of said rectangular frame adjacent said pick up and transfer device.

\* \* \* \* \*